United States Patent
Wang

(10) Patent No.: US 6,315,263 B1
(45) Date of Patent: *Nov. 13, 2001

(54) COLLAPSIBLE CIRCUIT BOARD MOUNT

(75) Inventor: Pei-Rong Wang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/231,927

(22) Filed: Jan. 14, 1999

(30) Foreign Application Priority Data

Jan. 14, 1998 (TW) .................................. 87200714

(51) Int. Cl.[7] .................................................. A47G 29/00
(52) U.S. Cl. ........................ 248/694; 248/346.3; 361/740; 361/754; 361/727; 361/684; 439/327; 439/377
(58) Field of Search ................................ 248/694, 346.3, 248/354.7; 361/740, 754, 727, 684; 439/327, 377, 64

(56) References Cited

U.S. PATENT DOCUMENTS

| | | | |
|---|---|---|---|
| 4,080,031 | * 3/1978 | Sawford-Atkins | 339/65 |
| 4,638,744 | * 1/1987 | Clive-Smith | 108/56.1 |
| 5,650,917 | * 7/1997 | Hsu | 361/759 |
| 5,829,601 | * 11/1998 | Yurchenco et al. | 211/41.17 |
| 5,889,656 | * 3/1999 | Yin | 361/801 |
| 5,928,024 | * 7/1999 | Ming-Huang | 439/377 |
| 5,943,218 | * 8/1999 | Liu | 361/801 |
| 5,980,299 | * 11/1999 | Davis | 439/377 |
| 6,000,960 | * 12/1999 | Wang et al. | 439/327 |
| 6,027,358 | * 2/2000 | Lai et al. | 439/327 |
| 6,031,715 | * 2/2000 | Magette | 361/683 |
| 6,031,725 | * 2/2000 | Scholder et al. | 361/759 |
| 6,038,131 | * 3/2000 | Valosen et al. | 361/756 |
| 6,056,579 | * 5/2000 | Richard, III et al. | 439/358 |
| 6,056,583 | * 5/2000 | Lee et al. | 439/377 |
| 6,089,899 | * 7/2000 | Wang et al. | 439/377 |

* cited by examiner

Primary Examiner—Ramon O. Ramirez
Assistant Examiner—Kimberly Wood
(74) Attorney, Agent, or Firm—Wei Te Chung

(57) ABSTRACT

A collapsible mount for mounting an electronic device to a circuit board includes a base adapted to be fixed to the circuit board and two support arms each having a lower end pivotably connected to the base and spaced from each other so as to be rotatable with respect to the base between a stowed position and an expanded position wherein the two support arms are substantially opposite to each other to define a space therebetween adapted to accommodate the electronic device therein.

8 Claims, 9 Drawing Sheets

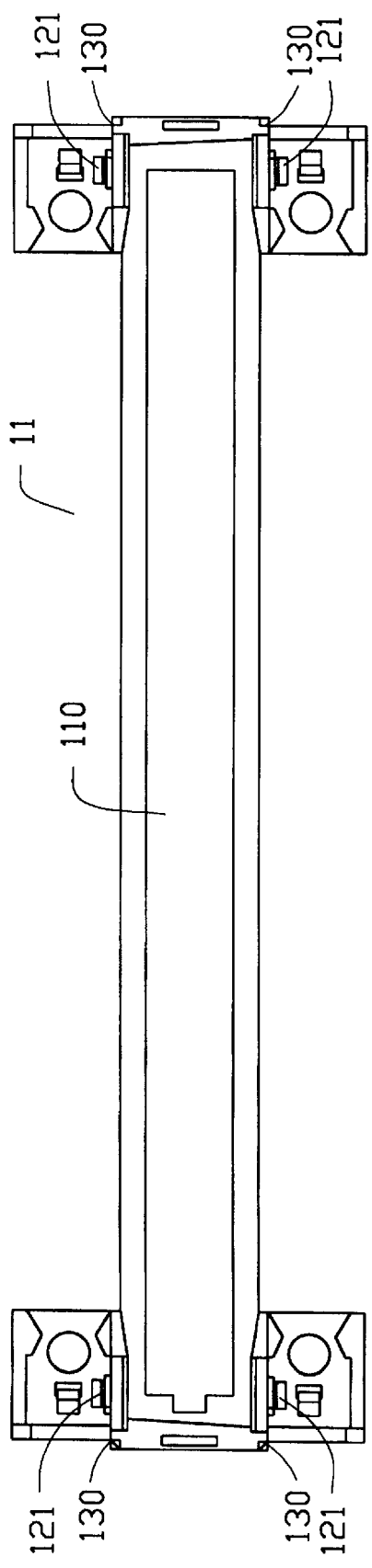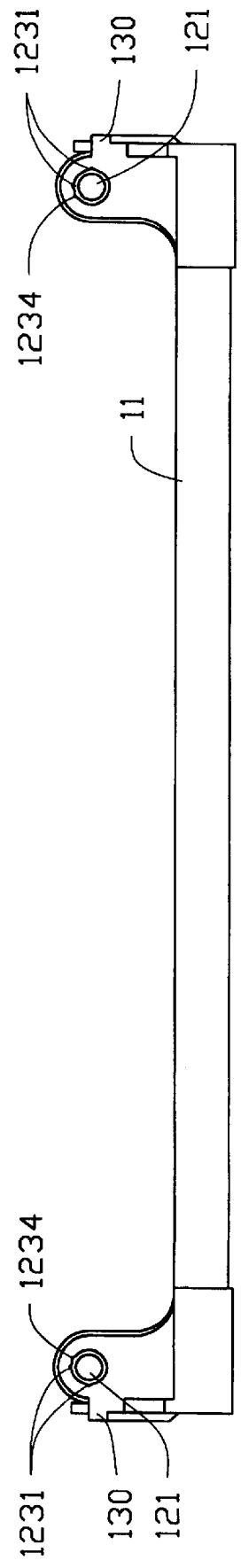
FIG. 3A
FIG. 3B

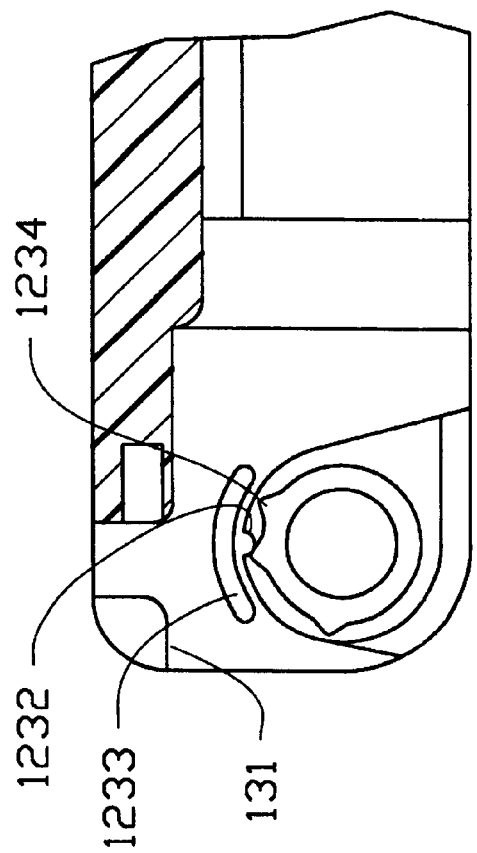
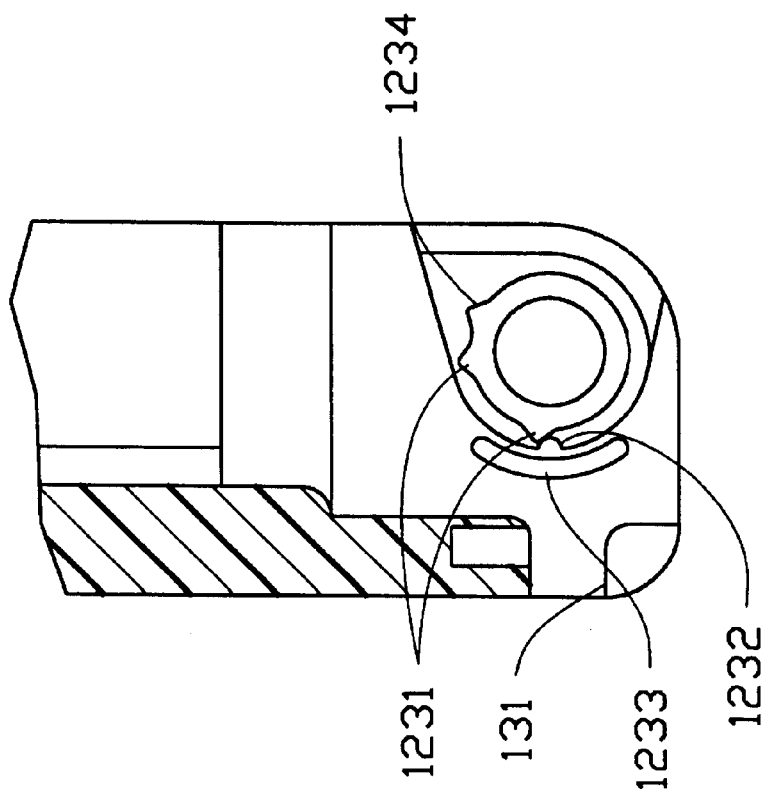
FIG. 8B
FIG. 8A

COLLAPSIBLE CIRCUIT BOARD MOUNT

BACKGROUND OF THE INVENTION

1. Field of the Invention

The present invention generally relates to a circuit board mount for mounting/connecting a circuit board or a CPU module to a main computer board and in particular to a collapsible circuit board mount which reduces the space occupied thereby at a stowed position.

2. The Prior Art

A connection device is commonly used to mount and connect a circuit board or an electronic component to a main computer board. Taking a central processing unit (CPU) of a computer as an example, the CPU is conventionally fixed to the main board by being directly soldered thereto. Nowadays, however, the CPU is first fixed to a circuit board to form a CPU module which is then mounted to the main board by means of a connection device. This helps to reduce the occupied space on the main board. The circuit board that is mounted to the main board by means of the connection device must be firmly supported by support means otherwise the circuit board that is usually perpendicular to the main board may shake or vibrate. Thus, a poor connection between the circuit board and the connection device may result thereby causing malfunction of the computer or the parts thereof.

Support means directly fixed on the connection device as a unitary member for retaining the circuit board on the connection device is disclosed in Taiwan Patent Application Nos. 85216861, 85216815, 85215723 and 85216150 and U.S. Pat. No. 3,993,390, 4,057,879, 5,207,598, 5,259,793 and 5,429,523, while in U.S. Pat. Nos. 2,825,037 and 3,829,741, support means that is separate from and additionally mounted to the connection device to support the circuit board is disclosed. Both types of support means have a common disadvantage that the support means constitutes an elongate support arm member that is generally not movable or collapsible with respect to the connection device thereby occupying a significant amount of space which is inconvenient for packing and transportation of the connection device.

In addition, the connection device of this type is usually mounted to the main board with fixing means having a complicated structure which makes manufacture laborious thereby increasing costs.

It is thus desirable to have a collapsible circuit board mount for connecting and mounting a circuit board to a main computer board that overcomes the problems encountered in the prior art.

SUMMARY OF THE INVENTION

Accordingly, an object of the present invention is to provide a circuit board mount which has two collapsible support arms that are rotatable with respect to a mount base so as to reduce the overall dimension of the mount at a stowed position.

Another object of the present invention to is provide a collapsible mount wherein a ratchet and paw system is incorporated between a base and support arms so as to selectively retain the support arms at an expanded position.

A further object of the present invention is to provide a collapsible mount wherein pivot pins are provided on a base to be rotatably received in holes defined in the support arms, the pivot pins having an inclined free end for facilitating insertion of the pivot pin into the respective hole of the support arm.

Still another object of the present invention is to provide a collapsible mount wherein a mount base comprises a plurality of fixing members for fixing the base to the main board, the fixing members having a simple structure thereby simplifying the manufacture thereof and reducing costs.

In accordance with an aspect of the present invention, a collapsible mount adapted to mount/connect an electronic device, such as a CPU module or a circuit board, to a main board, comprises a base fixed on the main board and two support arms pivotably connected to the base to be movable between a stowed position and an expanded position wherein the support arms are substantially opposite and spaced from each other to accommodate the electronic device therebetween. A positioning device is provided to retain the support arms at the expanded position.

The positioning device comprises a ratchet wheel formed on the base and having two spaced teeth respectively corresponding to the expanded position and the stowed position and a corresponding paw which is provided on the support arm to be movable therewith for selectively engaging one of the teeth of the ratchet wheel to position and retain the support arm at either the stowed position or the expanded position.

In accordance with another aspect of the present invention, the pivotal connection between each support arm and the base comprises two pivot pins extending from two sides of the base and two corresponding holes defined in each support arm for receiving the pivot pins therein. The pivot pins have an inclined free end which facilitates insertion of the pivot pins into the respective holes of the support arms.

In accordance with a further aspect of the present invention, the base of the collapsible mount comprises a plurality of channel members attached to the two sides thereof, each receiving an inner-threaded cylinder. A bore is defined in each channel member to be aligned with the inner-threaded cylinder for receiving a fastener therethrough for fixing the mount to the main board. Each channel member has two side walls each forming a triangular pawl opposite each other and defining a neck therebetween. The channel member further comprises an end wall having a pawl opposite the neck so as to retain an expanded bottom of the inner-threaded cylinder in the channel member.

BRIEF DESCRIPTION OF THE DRAWINGS

The present invention will become apparent to those skilled in the art by reading the following description of a preferred embodiment thereof, with reference to the accompanying drawings, in which:

FIG. 3A is a top plan view of a mount base of the collapsible mount;

FIG. 3B is a side view of FIG. 3A;

FIG. 8A is a partial cross-sectional view of a positioning device of the collapsible mount at the expanded position; and FIG. 8B is a partially cross-sectional view of the positioning device of the collapsible mount at the stowed position.

DETAILED DESCRIPTION OF THE PREFERRED EMBODIMENTS

Figure 1:
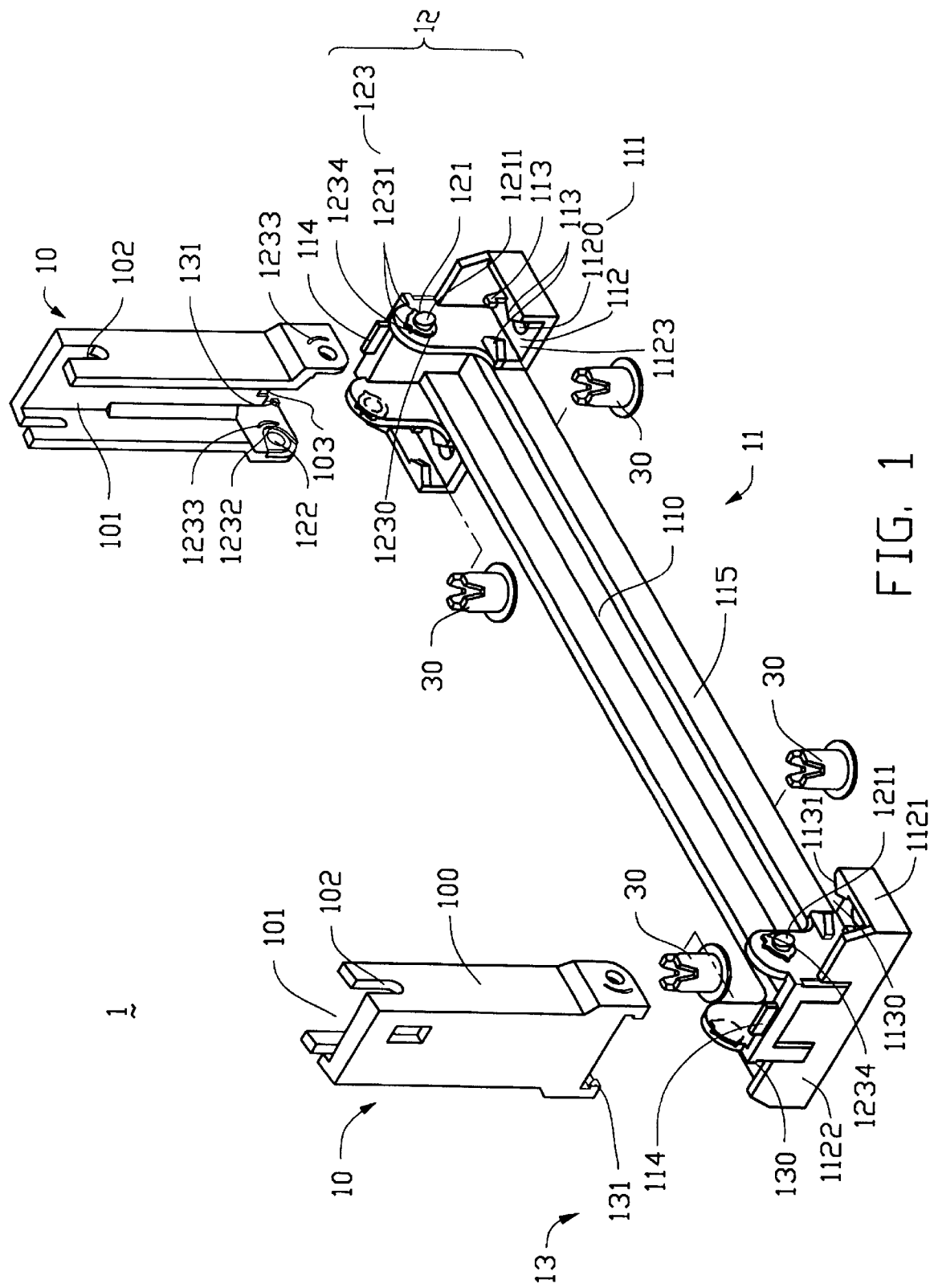
FIG. 1 exploded perspective view of a collapsible mount constructed in accordance with the present invention for mounting a circuit board or an electronic device to a computer main board.

With reference to the drawings and in particular to FIG. 1, a collapsible circuit board mount 1 constructed in accordance with the present invention comprises a mount base 11 adapted to be fixed to a main board (not shown). The mount base 11 has two opposite ends each having a support arm 10 pivotably attached thereto by means of a collapsing mechanism 12.

Figure 2A:
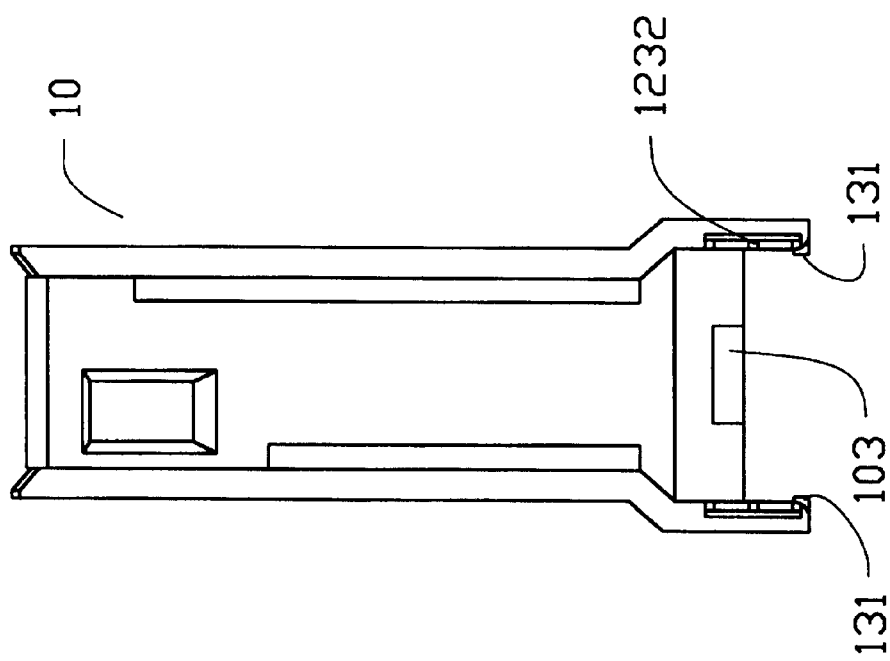
FIG. 2A is a front view of a support arm of the collapsible mount.
Figure 2B:
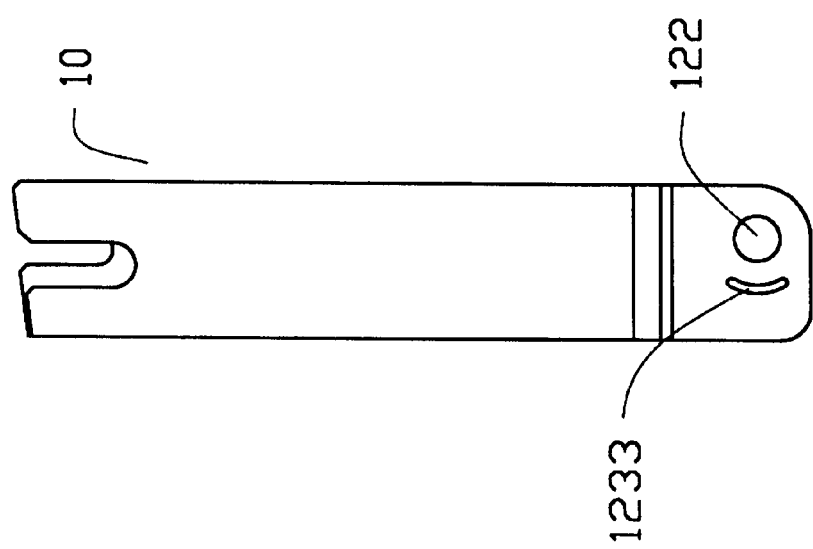
FIG. 2B is a side view of FIG. 2A.
Figure 2C:
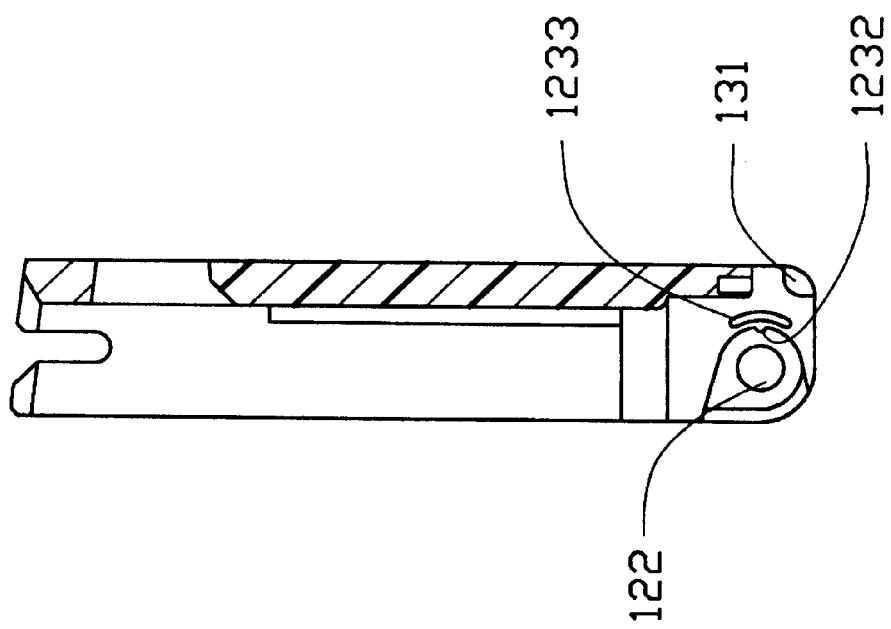
FIG. 2C is a cross-sectional view of FIG. 2A.
Figure 6:
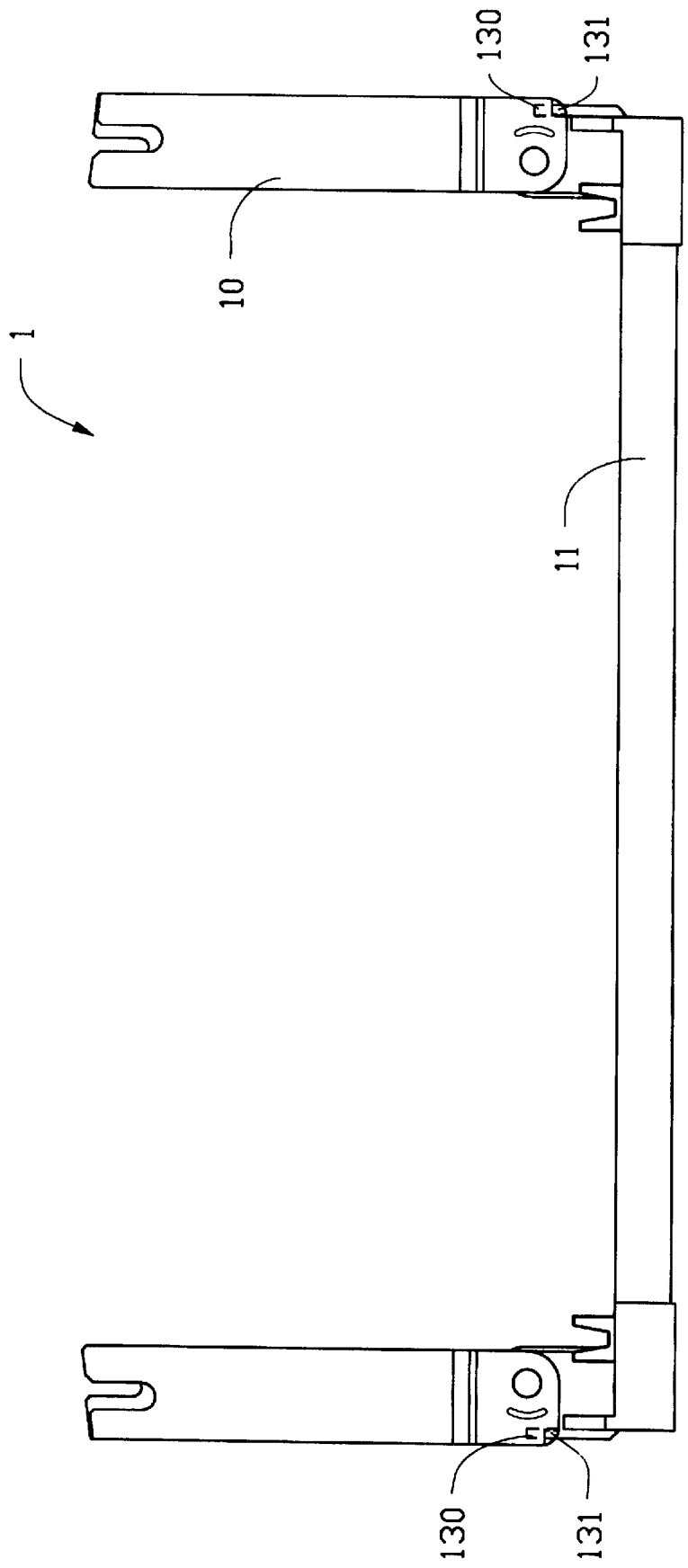
FIG. 6 is a side elevational view of the collapsible mount at an expanded position.
Figure 7:
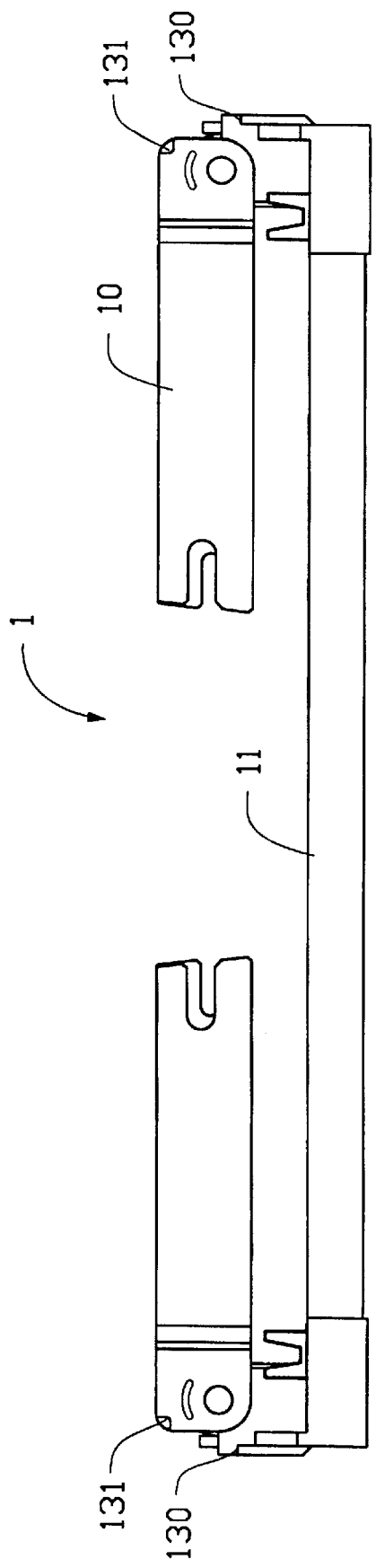
FIG. 7 is a side elevational view of the collapsible mount showing the support arms thereof at a stowed position.

Further referring to FIGS. 2A, 2B and 2C, the support arm 10 comprises an elongate body defining a channel 101 between two side walls 100 thereof for receiving and retaining an edge of a circuit board (not shown) to be mounted to the main board. A notch 102 is defined in each of the two side walls 100 at a first end of the support arm 10. Each of the side walls of the support arm 10 has a second end pivotably attached to the mount base 11 by means of the associated collapsing mechanism 12 thereby allowing the support arm 10 to be rotatable with respect to the mount base 11 between an expanded position (FIG. 6) and a stowed position (FIG. 7).

With further reference to FIGS. 3A and 3B, the mount base 11 comprises an elongate body defining a slot 110 therealong between two side walls 115 thereof for receiving a connector (not shown) fixed on the main board thereby fixing the circuit board mount 1 to the main board.

The collapsing mechanism 12 comprises two pivot pins 121 provided at each of two opposite ends of the elongate body of the mount base 11 and extending in opposite directions from the two side walls 115 of the mount base 11 to be substantially aligned with each other. The pivot pins 121 are respectively received in two corresponding holes 122 defined in the two side walls 100 of the respective support arm 10 at the second end thereof thereby forming a pivotal connection between the second end of the support arm 10 and the mount base 11.

Figure 4A:
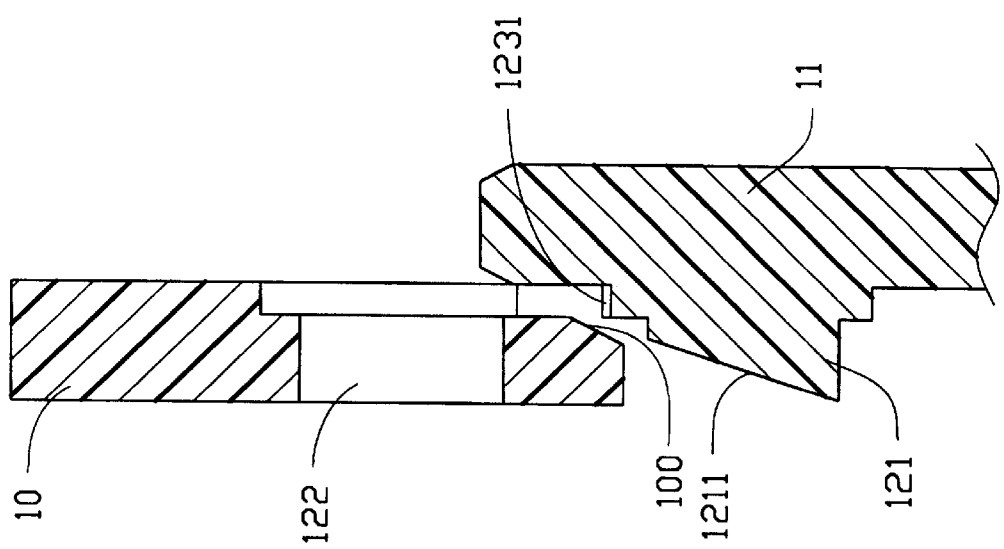
FIGS. 4B and 4C are sequential cross-sectional views of a portion of the support arm and the mount base, showing the pivotal connection therebetween.
Figure 4B:
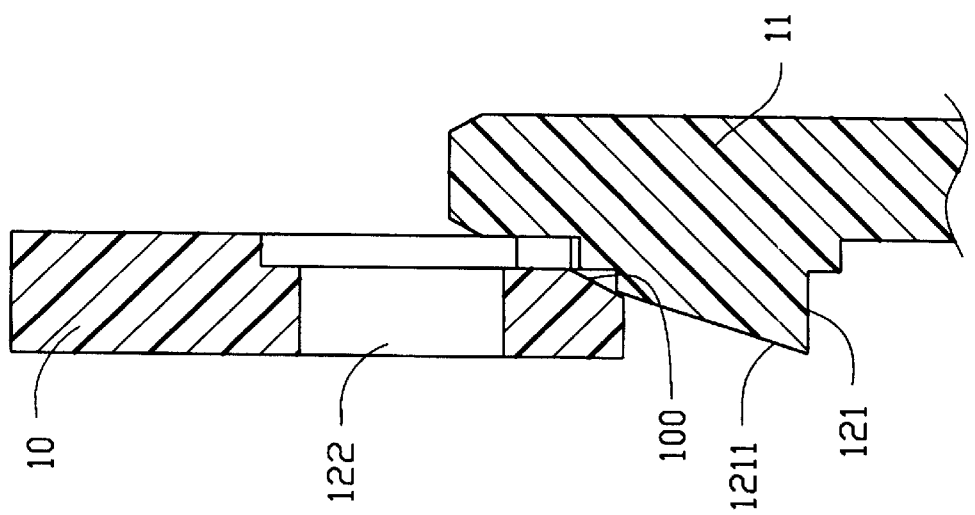
Figure 4C:
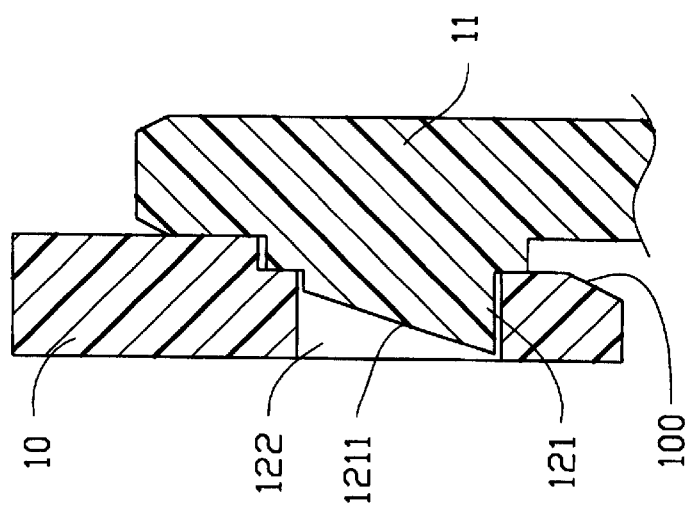

As particularly shown in FIGS. 4A, 4B and 4C, each of the pivot pins 121 of the mount base 11 comprises an inclined free end 1211 which facilitates the engagement of the pivot pin 121 into the corresponding hole 122 on the respective support arm 10. Preferably, a chamfer 100 is provided on the second end of the support arm 10 to cooperate with the inclined free end 1211 of the pivot pin 121 so as to further facilitate the insertion of the pivot pin 121 into the corresponding hole 122 on the support arm 10.

The support arm 10 also comprises retaining means 13 which retains the support arm 10 at the expanded position. The retaining means 13 comprises a first projection 131 formed on each of the side walls 100 of the support arm 10 and engageable with a second projection 130 formed on the side wall 115 of the mount base 11. The projections 131, 130 are shaped and positioned in such a way that when the support arm 10 is moved from the stowed position toward the expanded position, the first projection 131 of the support arm 10 is brought into engagement with the second projection 130 of the mount base 11 and a further rotation of the support arm 10 causes a deformation on each of the projections 130, 131 to allow the first projection 131 to slide over the second projection 130 thereby forming a tight engagement therebetween when the support arm 10 reaches the expanded position.

The engagement between the projections 130, 131 also provides a user of the collapsible circuit board mount 1 with a sense of the full expansion of the support arm 10.

The base mount 11 is provided on each of the two opposite ends thereof with a stop tab 114 which is receivable in and engaged by a recess 103 defined in the support arm 10 when the support arm 10 is in the expanded position which together with the retaining means 13 retains the support arm 10 at the expanded position.

The collapsing mechanism 12 further comprises positioning means 123 which comprises a paw 1232 formed on at least one of the side walls 100 of the support arm 10 and a corresponding ratchet wheel 1230 having two first teeth 1231 provided thereon respectively corresponding to the stowed position and the expanded position of the support arm 10, as shown in FIGS. 8A and 8B. FIG. 8A shows the support arm 10 at the expanded position and the paw 1232 engages one of the teeth 1231. FIG. 8B shows the support arm 10 at the stowed position and the paw 1232 engages the other tooth 1231. The engagement of the paw 1232 with the teeth 1231 prevents the support arm 10 from free rotation about the pivot pins 121 with respect to the base mount 11 and thus retains the support arm 10 at either the expanded position or the stowed position.

The teeth 1231 are shaped to allow the paw 1232 to disengage therefrom by applying a torque to the support arm 10 about the pivot pins 121.

The ratchet wheel 1230 further comprises a second tooth 1234 which is positioned to prevent the support arm 10 from being further lowered, due to gravity, from the stowed position as being engaged by the paw 1232.

The support arm 10 is also provided with an arced slot 1233 which is substantially concentric with the hole 122 which receives the pivot pin 121. The slot 1233 which is formed by removing a portion of the material of the support arm 10 provides the portion of the support arm 10 around the hole 122 with deformability thereby allowing the hole 122 to be more easily rotatable about the pivot pin 121 with less physical constraint.

The mount base 11 has a pair of fixing devices 111 provided on the two opposite side walls 115 at each end of the elongate body thereof. Each of the fixing devices 111 comprises a sideways projection 112 fixed to the elongate body of the mount base 11 and defining a bore therein.

Figure 5A:
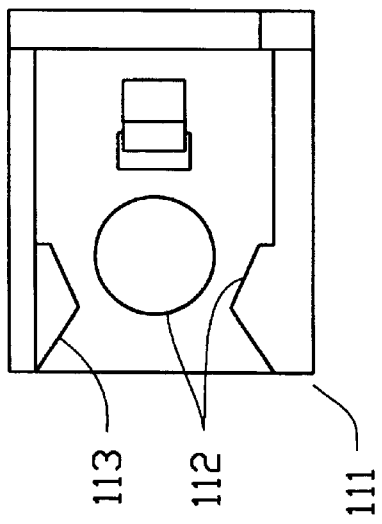
FIG. 5A is a top plan view of a fixing device of the collapsible mount.
Figure 5B:
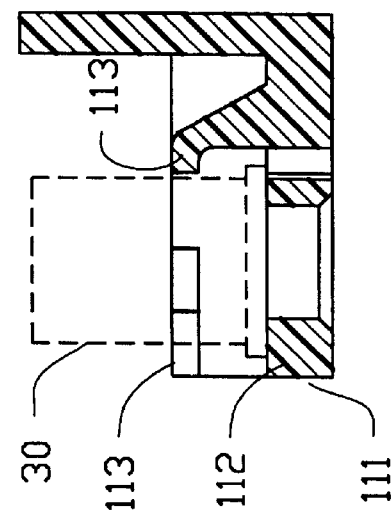
FIG. 5B is a cross-sectional view of the fixing device.

As shown in FIGS. 1, 5A and 5B, the sideways projection 112 forms two opposite side walls 1121 and an end wall 1122 thereby defining a channel 1123 therebetween. One of the side walls 1121 is fixed to or constitutes part of the elongate body of the mount base 11, for example it is attached to the side wall 115 of the mount base 11 as shown in the drawings. Each of the side walls 1121 and the end wall 1122 of the fixing device 111 is provided with a pawl 113. The pawls 113 of the side walls 1121 are opposite each other and each has a substantially triangular shape pointing toward each other thereby defining a neck 1130 therebetween. An inclined guiding edge 1131 is formed on each of the pawls 113 and converge together to define the neck 1130. An inner-threaded cylinder 30 has an outside diameter substantially corresponding to an inscribed circle defined between the pawls 113 and is fit into the channel 1123 of the sideways projection 112 by being guided and deformed by the inclined edges 1131 of the pawls 113 and retained by the pawls 113. The cylinder 30 has an expanded bottom end to retain the cylinder 30 in the channel 1123 of the sideways projection 112.

The inner-threaded cylinder 30 substantially corresponds to the bore 1120 of the projection 112 so as to be engaged by a bolt to fix the mount base 11 to the main board.

Although the present invention has been described with reference to a preferred embodiment thereof, it is apparent to those skilled in the art that a variety of modifications and changes may be made without departing from the scope of the present invention which is intended to be defined by the appended claims. For example, the ratchet wheel having teeth thereof may be alternatively positioned on the one of the base and the support arm, and the paw disposed on the other of the base and the support arm. For example, the stop tab may be alternatively positioned on one of the base and the support arm.

What is claimed is:

1. A collapsible mount for mounting an electronic device to a circuit board, comprising:

a base adapted to be fixed to the circuit board; and two support arms each having a lower end pivotably connected to the base and spaced from each other so as to be rotatable with respect to the base between a stowed position and an expanded position wherein the support arms are substantially opposite each other thereby defining a space therebetween adapted to accommodate the electronic device therein;

wherein the pivotal connection between each of the support arms and the base comprises two pivot pins extending in opposite directions from the base and wherein each of the support arms has two first side walls each defining a hole for engaging and rotatably receiving respective pivot pin therein;

wherein each of the first side walls of the support arm is provided with an arced slot substantially concentric with a corresponding hole of the support arm;

wherein the support arm forms a first projection having an upper surface and the base forms a second projection having a lower surface, the upper surface of the first projection engaging with the lower surface of the second projection when the support arm is moved to the expanded position to retain the support arm in the expanded position.

2. The collapsible mount as claimed in claim 1, wherein each of the pivot pins forms an inclined free end to facilitate engagement of the pivot pin into the hole.

3. The collapsible mount as claimed in claim 2, wherein each of the first side walls of the support arm is provided with a chamfer matingly engageable with the inclined free end of the respective pivot pin to further facilitate engagement of the pivot pin into the hole.

4. The collapsible mount as claimed in claim 1, wherein the support arm comprises positioning means which selectively and releasably retains the support arm at the expanded position and the stowed position, the positioning means comprising a ratchet wheel provided on the base and a pawl provided on the support arm, the ratchet wheel having two first teeth respectively corresponding to the expanded position and the stowed position, the pawl selectively engaging the first teeth for preventing the support arm from moving from one of the first teeth toward the other of the first teeth to thereby retain the support arm in the expanded position and the stowed position.

5. A mount structure comprising a base adapted to be fixed on a circuit board and two support arms spaced from each other thereby defining a space therebetween adapted to accommodate an electronic device therein, the base comprising a pair of fixing devices attached to each side of the base and adapted to fix the base to the circuit board, each of the fixing devices comprising a sideways projection extending from each side of the base and having two first side walls and an end wall thereby defining a channel therebetween, each of the first side walls forming a substantially triangular first pawl thereon, the first pawls being opposite each other thereby defining a neck therebetween, the end wall comprising a second pawl which, together with the first pawls of the first side walls, retains a cylindrical member in the channel, the cylindrical member defining an inner threaded first bore and the sideways projection defining a second bore corresponding to the first bore and adapted to receive a fastener therein for fixing the base to the circuit board.

6. The mount structure as claimed in claim 5, wherein each of the pawls of the fixing device comprises an inclined edge converging toward each other so as to guide the cylindrical member into the channel of the fixing device.

7. The mount structure as claimed in claim 6, wherein each of the support arms is pivotally attached to the base, thereby allowing the support arm to be movable between an expanded position and a stowed position.

8. A foldable mount for mounting an electronic device to a circuit board, comprising:

a base adapted to be fixed to the circuit board;

two support arms each having a lower end pivotably connected to the base and spaced from each other so as to be rotatable with respect to the base between a stowed position and an expanded position; and positioning means for retaining each of the support arms in either the stowed or expanded position, said positioning means including a ratchet wheel with teeth on one of the base and the support arm, and a pawl on the other of the base and the support arm;

wherein the support arm includes a first projection having an upper surface and wherein the base includes a second projection having a lower surface, the upper surface of the first projection engaging with the lower surface of the second projection when the support arm is moved to the expanded position for retaining the support arm in the expanded position;

wherein a stop tab is formed on one of said base and said support arm and is adapted to be received within a recess formed in the other of said base and said support arm for further retaining the support arm in the expanded position.

* * * * *